(12) United States Patent
Sauber et al.

(10) Patent No.: US 10,365,842 B2
(45) Date of Patent: Jul. 30, 2019

(54) SYSTEM AND METHOD FOR REDUCING POWER CONSUMPTION OF MEMORY

(71) Applicant: Dell Products L.P., Round Rock, TX (US)

(72) Inventors: William Sauber, Georgetown, TX (US); Stuart Allen Berke, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 135 days.

(21) Appl. No.: 15/236,034

(22) Filed: Aug. 12, 2016

(65) Prior Publication Data

US 2017/0052727 A1     Feb. 23, 2017

Related U.S. Application Data

(63) Continuation of application No. 12/791,563, filed on Jun. 1, 2010, now abandoned.

(51) Int. Cl.

| | |
|---|---|
| *G06F 3/06* | (2006.01) |
| *G06F 1/3225* | (2019.01) |
| *G06F 1/3234* | (2019.01) |
| *G11C 11/406* | (2006.01) |

(52) U.S. Cl.
CPC .......... *G06F 3/0625* (2013.01); *G06F 1/3225* (2013.01); *G06F 1/3275* (2013.01); *G06F 3/0634* (2013.01); *G06F 3/0653* (2013.01); *G06F 3/0659* (2013.01); *G06F 3/0673* (2013.01); *G11C 11/40611* (2013.01); *G11C 11/40615* (2013.01); *G11C 11/40618* (2013.01); *G11C 11/40622* (2013.01); *Y02D 10/14* (2018.01)

(58) Field of Classification Search
None
See application file for complete search history.

(56) References Cited

U.S. PATENT DOCUMENTS

| | | | |
|---|---|---|---|
| 5,901,105 | A  | 5/1999  | Ong et al. |
| 6,590,822 | B2 | 7/2003  | Hwang et al. |
| 6,819,617 | B2 | 11/2004 | Hwang et al. |
| 6,950,364 | B2 | 9/2005  | Kim |
| 6,992,943 | B2 | 1/2006  | Hwang et al. |

(Continued)

OTHER PUBLICATIONS

U.S. Appl. No. 12/629,681, filed Dec. 2, 2009, 33 pages.

*Primary Examiner* — Jared I Rutz
*Assistant Examiner* — Marwan Ayash
(74) *Attorney, Agent, or Firm* — Baker Botts L.L.P.

(57) ABSTRACT

Systems and methods for reducing problems and disadvantages associated with power consumption in memory devices are disclosed. In accordance with one embodiment of the present disclosure, a method for improving performance and reducing power consumption in memory may include tracking whether individual units of a memory system are active or inactive. The method may also include placing inactive individual units of the memory system in a self-refresh mode, such that the inactive individual units self-refresh their contents. The method may further include placing active individual units of the memory system in a command-based refresh mode, such that the active individual units are refreshed in response to a received command to refresh their contents.

21 Claims, 4 Drawing Sheets

(56) References Cited

U.S. PATENT DOCUMENTS

| | | |
|---|---|---|
| 7,088,635 B2 | 8/2006 | Hur et al. |
| 7,149,140 B2 | 12/2006 | Hur et al. |
| 7,349,278 B2 | 3/2008 | Min et al. |
| 7,426,151 B2 | 9/2008 | Kim et al. |
| 7,492,656 B2 | 2/2009 | Kim et al. |
| 7,953,921 B2 * | 5/2011 | Walker ................. G11C 11/406 365/222 |
| 2003/0023825 A1 * | 1/2003 | Woo ..................... G06F 12/023 711/170 |
| 2003/0028711 A1 * | 2/2003 | Woo ..................... G06F 1/3225 711/106 |
| 2003/0151967 A1 | 8/2003 | Nagai et al. |
| 2003/0156442 A1 * | 8/2003 | Origasa ................... G11C 5/06 365/52 |
| 2003/0174559 A1 | 9/2003 | Cooper et al. |
| 2005/0132131 A1 * | 6/2005 | David ................ G11C 11/4076 711/105 |
| 2006/0044909 A1 * | 3/2006 | Kinsley ................ G11C 11/406 365/222 |
| 2007/0106860 A1 * | 5/2007 | Foster, Sr. ............ G06F 1/3225 711/170 |
| 2007/0253268 A1 | 11/2007 | Kim et al. |
| 2008/0056047 A1 | 3/2008 | Jain et al. |
| 2009/0172270 A1 | 7/2009 | Kardach et al. |
| 2013/0100755 A1 * | 4/2013 | Youn ................. G11C 11/40615 365/222 |

* cited by examiner

| BANK | RANK | | | | | | | |
|---|---|---|---|---|---|---|---|---|
| | 0 | 1 | 2 | 3 | 4 | 5 | 6 | 7 |
| 0 | S | C | S | C | S | C | C | C |
| 1 | S | C | C | S | C | S | C | C |
| 2 | S | C | S | C | S | S | S | C |
| 3 | S | S | S | S | S | S | C | S |
| 4 | S | S | C | C | S | S | C | C |
| 5 | S | S | S | C | S | S | C | C |
| 6 | S | C | S | S | C | C | S | C |
| 7 | C | C | S | C | S | C | C | C |

SYSTEM AND METHOD FOR REDUCING POWER CONSUMPTION OF MEMORY

RELATED APPLICATION

This application is a continuation of U.S. patent application Ser. No. 12/791,563 filed Jun. 1, 2010, which is related to copending patent application Ser. No. 12/629,881, filed on Dec. 2, 2009, the contents of which are incorporated by reference herein.

TECHNICAL FIELD

The present disclosure relates in general to improving performance and reducing power consumption in information handling systems, and more particularly to improving performance and reducing power consumption of memory.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often use memory to store data and/or instructions. Broadly speaking, the term memory refers to computer components, devices, and recording media that retain digital data used for processing for some interval of time. A commonly-used type of memory is known as dynamic random access memory (DRAM). DRAM is a type of random access memory that stores each bit (or cell) of data in a separate capacitive element within an integrated circuit. Because capacitors leak charge, the information eventually fades unless the capacitor charge is refreshed periodically. Such refreshing of DRAM cells limits useful work performed by a memory system and consumes power. As the density and operating frequency of DRAMs increase, so too do limitations on useful work and the power consumed by DRAMs. Limitations on useful work will reduce overall system performance and efficiency. Consumption of additional power may lead to higher operating temperatures for the DRAMs and the information handling systems in which such DRAMs are present, which may affect operability of an information handling system and its components. In addition, such consumption of power may lead to higher operating costs due to increased energy costs associated with operation, as well as costs associated with cooling systems to mitigate increased temperatures.

SUMMARY

In accordance with the teachings of the present disclosure, the disadvantages and problems associated with performance reduction and power consumption due to refresh in memory devices have been substantially reduced or eliminated.

In accordance with one embodiment of the present disclosure, a method for improving performance and reducing power consumption in memory may include tracking whether individual units of a memory system are active or inactive. The method may also include placing inactive individual units of the memory system in a self-refresh mode, such that the inactive individual units self-refresh their contents. The method may further include placing active individual units of the memory system in a command-based refresh mode, such that the active individual units are refreshed in response to a received command to refresh their contents.

In accordance with another embodiment of the present disclosure, an information handling system may include a processor and a memory system communicatively coupled to the processor. The memory system may include individual units for storage of data and a memory controller communicatively coupled to the individual units. The memory controller may be configured to (i) track whether the individual units are active or inactive, (ii) place inactive individual units in a self-refresh mode, such that the inactive individual units self-refresh their contents, (iii) and place active individual units in a command-based refresh mode, such that the active individual units are refreshed in response to a received command to refresh their contents.

In accordance with a further embodiment of the present disclosure, a memory system may include individual units for storage of data and a memory controller communicatively coupled to the individual units. The memory controller may be configured to (i) track whether the individual units are active or inactive, (ii) place a first region including only inactive individual units in a self-refresh mode, such that the individual units of the first region self-refresh their contents, and (iii) place a second region including active individual units and inactive individual units in a command-based refresh mode, such that the individual units of the second region are refreshed in response to a received command to refresh their contents.

Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-7, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape drive), compact disk, CD-ROM, DVD, random access memory (RAM), read-only memory (ROM), electrically erasable programmable read-only memory (EEPROM), and/or flash memory; as well as communications media such wires, optical fibers, microwaves, radio waves, and other electromagnetic and/or optical carriers; and/or any combination of the foregoing.

Figure 1:
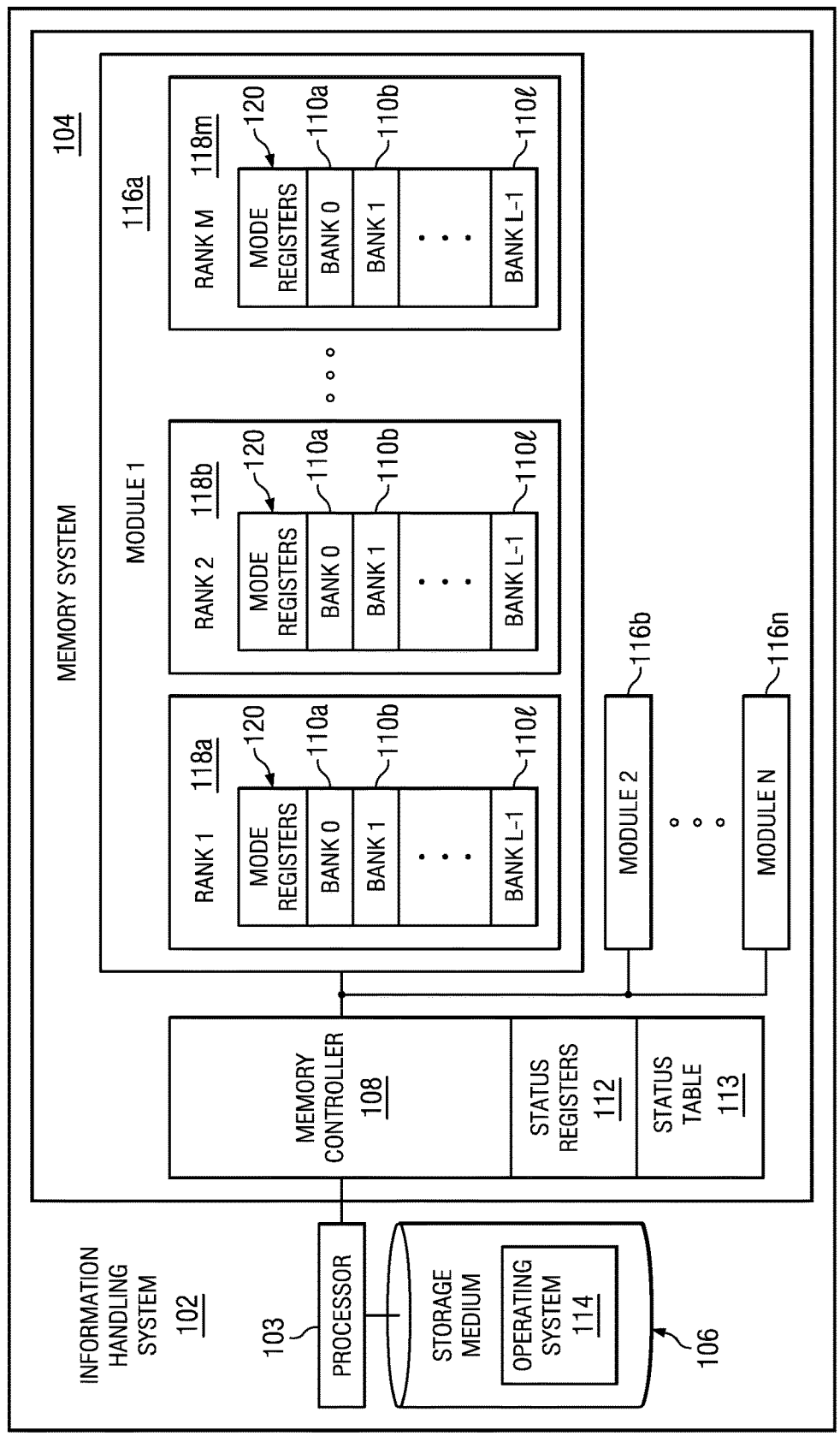
FIG. 1 illustrates a block diagram of an example information handling system in accordance with certain embodiments of the present disclosure.

FIG. 1 illustrates a block diagram of an example information handling system 102 in accordance with certain embodiments of the present disclosure. In certain embodiments, information handling system 102 may comprise a computer chassis or enclosure (e.g., a server chassis holding one or more server blades). In other embodiments, information handling system 102 may be a personal computer (e.g., a desktop computer or a portable computer). As depicted in FIG. 1, information handling system 102 may include a processor 103, a memory system 104 communicatively coupled to processor 103, and a storage medium 106 communicatively coupled to processor 103.

Processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored and/or communicated by one or more of memory system 104, storage medium 106, and/or another component of information handling system 100.

Memory system 104 may be communicatively coupled to processor 103 and may comprise any system, device, or apparatus operable to retain program instructions or data for a period of time (e.g., computer-readable media). Memory system 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory system 104 may comprise dynamic random access memory (DRAM).

As shown in FIG. 1, memory system 104 may include memory controller 108, one or more memory modules 116a-116n communicatively coupled to memory controller 108, and status registers 112 communicatively coupled to memory controller 108. Memory controller 108 may be any system, device, or apparatus configured to manage and/or control memory system 104. For example, memory controller 108 may be configured to read data from and/or write data to memory modules 116 comprising memory system 104. Additionally or alternatively, memory controller 108 may be configured to refresh memory modules in embodiments in which memory system 104 comprises DRAM. Although memory controller 108 is shown in FIG. 1 as an integral component of memory system 104, memory controller 108 may be separate from memory system 104 and/or may be an integral portion of another component of information handling system 102 (e.g., memory controller 108 may be integrated into processor 103).

Each memory module 116 may include any system, device or apparatus configured to retain program instructions and/or data for a period of time (e.g., computer-readable media). Each memory module 116 may include a dynamic random access memory (DRAM) module (e.g, a dual in-line package (DIP) memory, a Single In-line Pin Package (SIPP) memory, a Single Inline Memory Module (SIMM), a Ball Grid Array (BGA)), or any other suitable memory.

As depicted in FIG. 1, each memory module 116 may include one or more ranks 118a-118m. Each memory rank 118 within a memory module 116 may be a block or area of data created using some or all of the memory capacity of the memory module 116. In some embodiments, each rank 118 may be a rank as such term in defined by the Joint Electron Device Engineering Council (JEDEC) Standard for memory devices.

Also as shown in FIG. 1, each rank 118 may include mode registers 120 and one or more memory banks 110. Each memory bank 110 may be a logical unit of storage within memory system 104, which may be based on physical parameters of the memory module 116 comprising such memory bank 110.

Mode registers 120 may include one or more configuration variables and/or parameters associated with memory system 104. When reading, writing, refreshing, and/or performing other operations associated with memory system 104, a memory module 116 may carry out such operations based at least in part on configuration parameters and/or variables stored in mode registers 120. In some embodiments, mode registers 120 may be defined by a Joint Electron Device Engineering Council (JEDEC) standard for memory devices.

Status registers 112 may include one or more configuration variables and/or parameters associated with memory system 104. When reading, writing, refreshing, and/or performing other operations associated with memory system 104, memory controller 108 may carry out such operations based at least in part on configuration parameters and/or variables stored in status registers 112. In some embodiments, status registers 112 may include registers similar to mode registers 120.

Status table 113 may include one or more configuration variables and/or parameters associated with individual banks 110 (or other unit of memory) of memory modules 116. In particular, as described in greater detail below, individual entries of status table 113 may indicate whether a particular bank 110 (or other unit of memory) is in a self-refresh mode or command refresh mode.

Storage medium 106 may be communicatively coupled to processor 104. Storage medium 106 may include any system, device, or apparatus operable to store information processed by processor 103. Storage medium 106 may include, for example, network attached storage, one or more direct access storage devices (e.g., hard disk drives), and/or one or more sequential access storage devices (e.g., tape drives). As shown in FIG. 1, storage medium 106 may have stored thereon an operating system (OS) 114. OS 114 may be any program of executable instructions, or aggregation of programs of executable instructions, configured to manage and/or control the allocation and usage of hardware resources such as memory, CPU time, disk space, and input and output devices, and provide an interface between such hardware resources and application programs hosted by OS 114. Active portions of OS 114 may be transferred to memory 104 for execution by processor 103.

In operation, processor 103 and/or memory controller 108 may manage and control the various banks 110 such that one or more banks 110 (or other units of memory) may be enabled to self-refresh, while one or more other banks 110 (or other units of memory) may be enabled to refresh as a result of a refresh command from memory controller 108. Such selective enabling of banks 110 (or other memory units) for self-refresh and command-based refresh may provide improved performance and power savings, as "inactive" areas of memory system 104 (e.g., those banks 110 that are not currently being accessed, but still require data to be retained) may be enabled for self-refresh, while other "active" areas of memory system 104 (e.g, those banks 110 accessed more frequently) that would typically often require command-based refresh due to the activity of such areas, may be enabled for command-based refresh. Because a self-refresh operation does not require a command, other commands may be issued and less power is consumed than a command-based refresh. Such selective enabling may allow for improved performance and reduced power consumption as compared with traditional memory systems.

Figure 2:
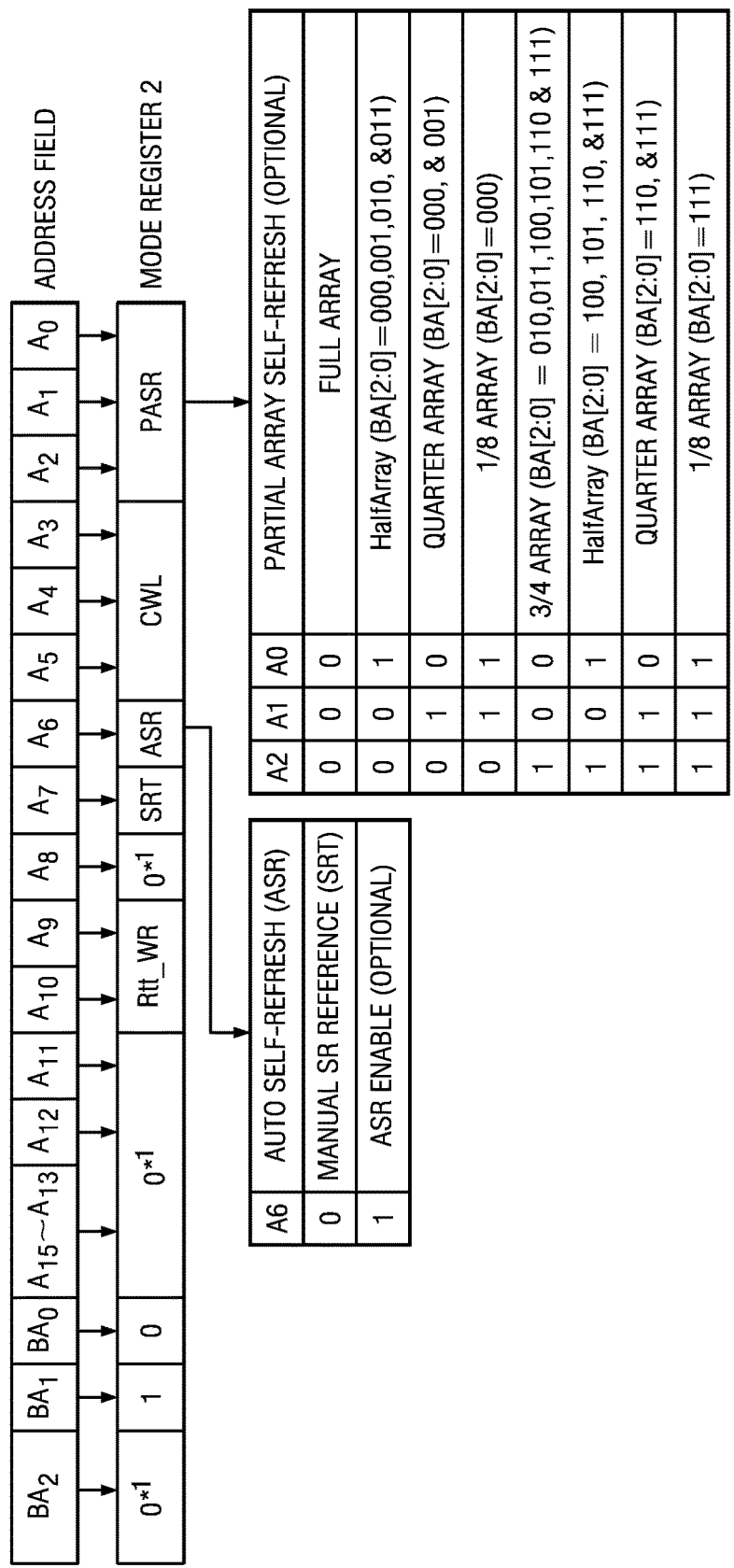
FIG. 2 illustrates various fields associated with mode register MR2 of a DRAM according to the JEDEC Specification, in accordance with certain embodiments of the present disclosure.

FIG. 2 illustrates various fields associated with mode register MR2 of a DRAM according to the JEDEC Specification, in accordance with certain embodiments of the present disclosure. As shown in FIG. 2, mode register MR2 includes a three-bit field labeled as PASR or "Partial Array Self-Refresh." By appropriately setting this field as memory pages and banks 110 are allocated and deallocated in memory system 104, such PASR field may indicate to memory controller 108 a fraction (e.g., one-eighth, one-fourth, one-half, three-fourths, all) of the banks 110 that are in use. Accordingly, during self-refresh, only a portion of the memory banks 110, as indicated by the PASR field, may be refreshed, which may reduce power consumption associated with refresh as compared to traditional approaches. However, the use of Partial Array Self-Refresh in accordance with the JEDEC standard may not be sufficient for all applications. For example, PASR enables self-refresh of certain banks 110, but those banks not so enabled are not refreshed, either by command or self-refresh. Accordingly, PASR is not sufficient in applications in which all data or a very large portion of data in a memory module 116 must be refreshed.

Nonetheless, an approach similar to identifying particular blocks 110 similar to that of PASR, which may be referred to as "Partial Array Standby" in this disclosure, may be utilized. For example, the existing JEDEC Specification may be extended (e.g., by addition of another mode register and functionality for supporting such mode register) such that a field similar to that of PASR may designate a fraction (e.g., one-eighth, one-fourth, one-half, three-fourths, all) of banks 110 that will be enabled for self-refresh, and those banks 110 not enabled for self-refresh may be instead enabled for command-based refresh.

Figures 3, 4:
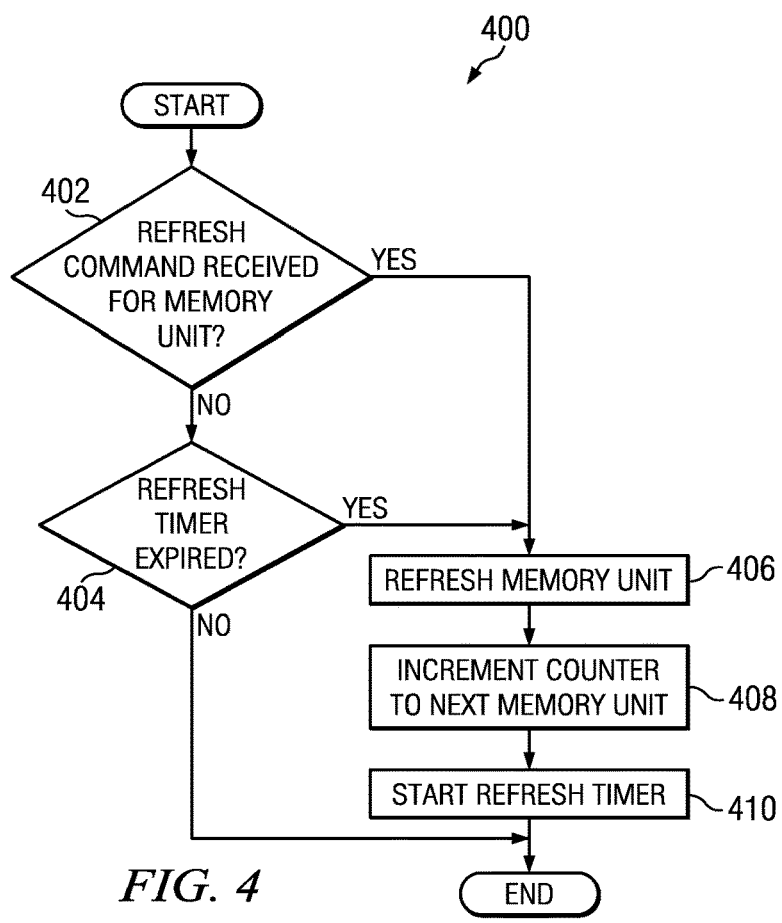
FIG. 3 illustrates an example status table for a memory system including eight ranks and eight banks, in accordance with certain embodiments of the present disclosure.
FIG. 4 illustrates a flow chart of an example method for performing refresh within a memory unit, in accordance with certain embodiments of the present disclosure.

Alternatively, rather than identify a fraction of banks 110 (or fraction of another unit of memory), banks 110 enabled for self-refresh and command-based refresh may be identified on a bank-by-bank basis (or based on another unit of memory) in status table 113. FIG. 3 illustrates an example status table 113 for a memory system 104 including one or more memory modules 116 of eight ranks 118 and eight banks 110 each. In the example status table 113 of FIG. 3, a letter "C" indicates a bank 110 enabled for command-based refresh, while an "S" indicates a bank enabled for self-refresh. While FIG. 1 depicts status table 113 as being integral to memory system 104, such status table 113 may be maintained by operating system 114 or another program of instructions executing on 103, in which case the identity of the command-based and self-refresh banks could be communicated to memory controller 108 via firmware using Advanced Configuration and Power Interface (ACPI) extensions, or via any other suitable manner.

In some embodiments, regions of memory system 104 enabled for command-based refresh may be associated with collections of active threads (e.g., associated with active virtual machines) while those regions of memory system enabled for self-refresh may be associated with collections of inactive threads (e.g., associated with inactive virtual machines).

In addition, although the foregoing discussion has discussed the enabling of banks 110 for either of command-based or self-refresh, the enabling of portions of memory system 104 may be at a granularity finer or coarser than that of a bank 110. For example, in some embodiments, enabling of portions of memory for command-based or self-refresh may be made on at the memory page level, the memory block level, or any other suitable unit of memory.

FIG. 4 illustrates a flow chart of an example method 400 for performing refresh within a memory unit (e.g., rank or other unit of memory), in accordance with certain embodiments of the present disclosure. According to one embodiment, method 400 may begin at step 402. As noted above, teachings of the present disclosure may be implemented in a variety of configurations of information handling system 102. As such, the initialization point for method 400 and the order of the steps 402-410 comprising method 400 may depend on the implementation chosen.

At step 402, the memory unit may determine whether a refresh command has been received from memory controller 402. If a refresh command is received, method 400 may proceed to step 406. Otherwise, if a refresh command is not received, method 400 may proceed to step 404.

At step 404, the memory unit may determine whether a refresh timer for it has expired. In certain embodiments, such refresh timer may run on a clock external to the memory unit, rather than internal to the memory unit, to allow synchronizer with refresh timing of memory controller 108. If the refresh timer has expired, method 400 may proceed to step 406. Otherwise, if the refresh timer has not expired, method 400 may end.

At step 406, in response to a determination that either a refresh command has been received or a refresh timer expired, the memory unit may be refreshed.

At step 408, a counter may be incremented, such that method 400 may be implemented for a subsequent memory unit.

At step 410, a refresh timer may be started again (e.g., for the subsequent memory unit). After completion of step 410, method 400 may end with respect to one memory unit, then proceed to step 402 to begin again for a subsequent memory unit.

Although FIG. 4 discloses a particular number of steps to be taken with respect to method 400, method 400 may be executed with greater or lesser steps than those depicted in FIG. 4. In addition, although FIG. 4 discloses a certain order of steps to be taken with respect to method 400, the steps comprising method 400 may be completed in any suitable order.

Method 400 may be implemented using information handling system 102 or any other system operable to implement method 400. In certain embodiments, method 400 may be implemented partially or fully in software and/or firmware embodied in computer-readable media.

Figure 5:
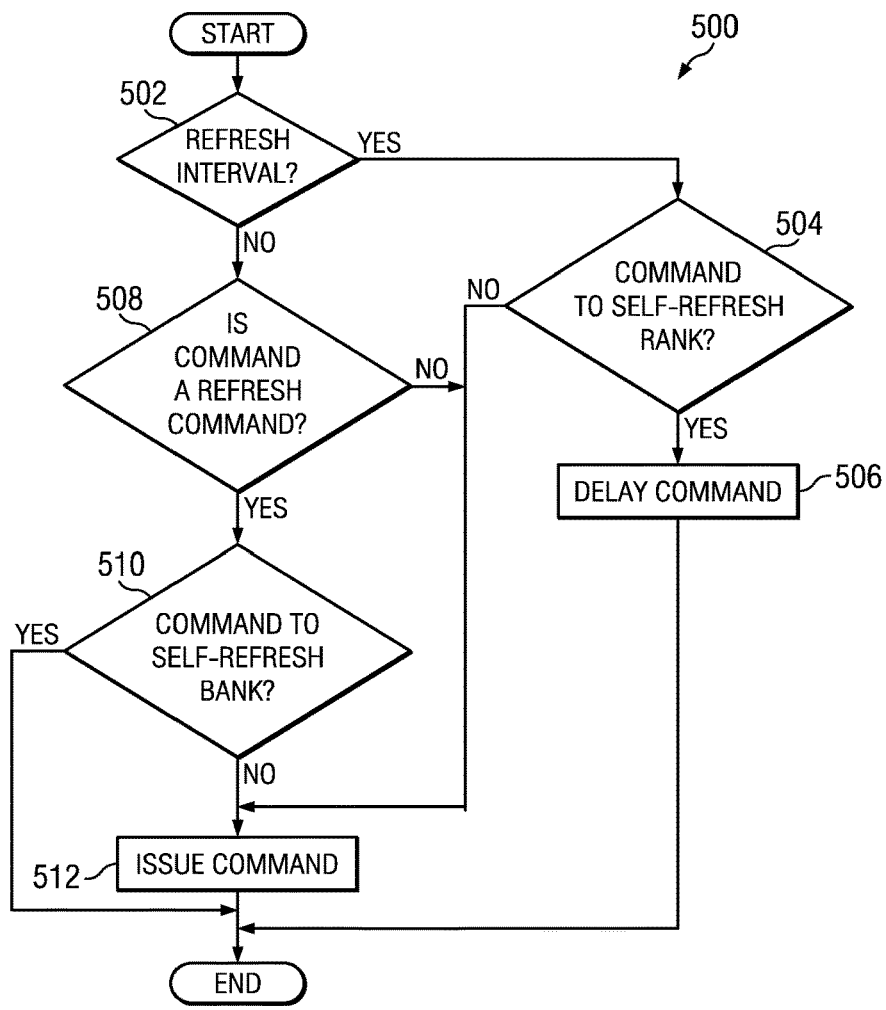
FIG. 5 illustrates a flow chart of an example method of execution for a filter of a memory controller in which memory controller commands would be generated in a conventional manner upstream of such filter, in accordance with certain embodiments of the present disclosure.

FIG. 5 illustrates a flow chart of an example method 500 of execution for a filter of memory controller 108 in which memory controller commands would be generated in a conventional manner upstream of such filter. The filter represented by method 500 may block explicit refresh commands to self-refresh banks and may delay commands to ranks with banks being self-refreshed. Also, in accordance with method 500, if self-refresh is active in a rank 118, other commands to such rank 118 may be disabled to prevent excessive power consumption. According to one embodiment, method 500 may begin at step 502. As noted above, teachings of the present disclosure may be implemented in a variety of configurations of information handling system 102. As such, the initialization point for method 500 and the order of the steps 502-512 comprising method 500 may depend on the implementation chosen.

At step 502, memory controller 108 may determine if a particular bank 110 and/or rank 118 is presently in a refresh interval. The refresh interval may be an interval in which self-refresh occurs in designated banks 110. The interval may be based on a table of self-refresh banks and a master timer synchronized with each rank 118 at start up. Memory controller 108 may be aware which bank (as well as rank) for which a refresh command is destined (e.g., by reference to status table 113). If presently in a refresh interval, method 500 may proceed to step 504. If not presently in a refresh interval, method 500 may proceed to step 508.

At step 504, memory controller 108 may determine if a command is to a rank 118 which contains a bank currently being self refreshed. If the command is to a rank 118 which contains a bank currently being self-refreshed, method 500 may proceed to step 506. Otherwise, method 500 may proceed to step 512. Step 504 may prevent an internal self-refresh conflict with a controller command.

At step 506, memory controller 108 may delay the command to self-refresh a rank 118. After completion of step 506, method 500 may end.

At step 508, memory controller 108 may determine if a generated command is a refresh command. If the command is a refresh command, method 500 may proceed to step 510. Otherwise, if the command is not a refresh command, method 500 may proceed to step 512.

At step 510, memory controller may determine if the generated command is a command to self-refresh a bank 110 per table 113. If the command is a command to self-refresh a bank 110, method 500 may end. Otherwise, if the command is not a command to self-refresh a bank 110, method 500 may proceed to step 512.

At step 512, memory controller 108 may issue the generated command. After completion of step 512, method 500 may end.

Although FIG. 5 discloses a particular number of steps to be taken with respect to method 500, method 500 may be executed with greater or lesser steps than those depicted in FIG. 5. In addition, although FIG. 5 discloses a certain order of steps to be taken with respect to method 500, the steps comprising method 500 may be completed in any suitable order.

Method 500 may be implemented using information handling system 102 or any other system operable to implement method 500. In certain embodiments, method 500 may be implemented partially or fully in software and/or firmware embodied in computer-readable media.

Figure 6:
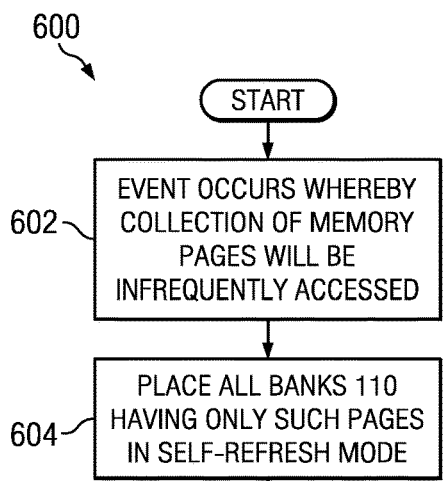
FIG. 6 illustrates a flow chart of an example method for transitioning a collection of banks (or other unit of memory) from a command-based refresh mode to a self-refresh mode, in accordance with certain embodiments of the present disclosure.

FIG. 6 illustrates a flow chart of an example method 600 for transitioning a collection of banks 110 (or other unit of memory) from a command-based refresh mode to a self-refresh mode, in accordance with certain embodiments of the present disclosure. According to one embodiment, method 600 may begin at step 602. As noted above, teachings of the present disclosure may be implemented in a variety of configurations of information handling system 102. As such, the initialization point for method 600 and the order of the steps 602-604 comprising method 600 may depend on the implementation chosen.

At step 602, an event may occur whereby a collection of memory pages of memory system 104 may become infrequently accessed or inactive. For example, a virtual machine executing on processor 103 may become inactive, thereby rendering data and instructions associated with such virtual machine inactive in memory system 104.

At step 604, in response to memory pages becoming inactive, memory controller 108 may place all banks 110 having only such inactive pages in self-refresh mode (e.g., may appropriately update status table 113 to indicate transition to self-refresh mode). After completion of step 604, method 600 may end.

Although FIG. 6 discloses a particular number of steps to be taken with respect to method 600, method 600 may be executed with greater or lesser steps than those depicted in FIG. 6. In addition, although FIG. 6 discloses a certain order of steps to be taken with respect to method 600, the steps comprising method 600 may be completed in any suitable order.

Method 600 may be implemented using information handling system 102 or any other system operable to implement method 600. In certain embodiments, method 600 may be implemented partially or fully in software and/or firmware embodied in computer-readable media.

Figure 7:
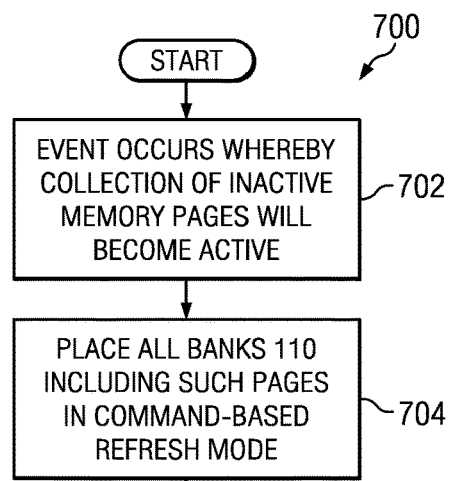
FIG. 7 illustrates a flow chart of an example method for transitioning a collection of banks (or other unit of memory) from a self-refresh mode to a command-based refresh mode, in accordance with certain embodiments of the present disclosure.

FIG. 7 illustrates a flow chart of an example method 700 for transitioning a collection of banks 110 (or other unit of memory) from a self-refresh mode to a command-based refresh mode, in accordance with certain embodiments of the present disclosure. According to one embodiment, method 700 may begin at step 702. As noted above, teachings of the present disclosure may be implemented in a variety of configurations of information handling system 102. As such, the initialization point for method 700 and the order of the steps 702-704 comprising method 700 may depend on the implementation chosen.

At step 702, an event may occur whereby a collection of inactive memory pages of memory system 104 may become active. For example, an inactive virtual machine executing on processor 103 may become active, thereby rendering data and instructions associated with such virtual machine active in memory system 104.

At step 704, in response to memory pages becoming active, memory controller 108 may place all banks 110 having such active pages in command-based mode (e.g., may appropriately update status table 113 to indicate transition to command-based refresh mode). After completion of step 704, method 700 may end.

Although FIG. 7 discloses a particular number of steps to be taken with respect to method 700, method 700 may be executed with greater or lesser steps than those depicted in FIG. 7. In addition, although FIG. 7 discloses a certain order of steps to be taken with respect to method 700, the steps comprising method 700 may be completed in any suitable order.

Method 700 may be implemented using information handling system 102 or any other system operable to implement method 700. In certain embodiments, method 700 may be implemented partially or fully in software and/or firmware embodied in computer-readable media.

Although the present disclosure has been described in detail, it should be understood that various changes, substitutions, and alterations can be made hereto without departing from the spirit and the scope of the disclosure as defined by the appended claims. As a specific example, although the embodiments above describe enabling refresh on a per bank basis for the purposes of simplicity and exposition, any appropriate level of granularity, whether a larger or smaller granularity than a bank, may be used.

What is claimed is:

1. A method for improving performance and reducing power consumption in a memory hardware system, comprising:
    tracking, by a memory controller, whether individual units of the memory system are active or inactive, wherein an inactive individual unit is an individual unit that is in use, but not currently being accessed;
    placing, by the memory controller, inactive individual units of the memory system in a self-refresh mode, such that the inactive individual units self-refresh their contents;
    filtering, by the memory controller, memory controller commands generated upstream of the memory controller, the filtering including:
        determining that a first memory controller command is directed to a first inactive individual unit of the memory system that is in a refresh interval, and in response, delaying the first memory controller command to the inactive individual unit of the memory system to prevent an internal self-refresh conflict with the first memory controller command;
        determining that a second memory controller command is directed to a second inactive individual unit of the memory system that is not in a refresh interval, and in response, determining that the second memory controller command is an explicit refresh command;
        in response to determining that the second memory controller command is the explicit refresh command, blocking the explicit refresh command to the second inactive individual unit of the memory system placed in the self-refresh mode; and
    placing, by the memory controller, active individual units of the memory system in a command-based refresh mode, such that the active individual units are refreshed in response to a received command to refresh their contents.

2. A method according to claim 1, wherein an individual unit of the memory system comprises one of a block, a page, a bank, and a rank.

3. A method according to claim 1, wherein:
    each individual unit of the memory system comprises a page;
    tracking whether individual units of the memory system are active or inactive includes tracking whether individual pages are active or inactive; and
    placing inactive individual units of the memory system in a self-refresh mode includes placing banks having only inactive pages in a self-refresh mode, such that such banks self-refresh their contents.

4. A method according to claim 1, further comprising setting at least one variable indicating which individual units of the memory system are to be placed in the self-refresh mode, and which individual units of the memory system are to be placed in the command-based refresh mode.

5. A method according to claim 4, wherein the at least one variable is stored in a table such that an entry of the table is associated with an individual unit of the memory system and indicates whether such individual unit of the memory system is to be placed in self-refresh mode or command-based refresh mode.

6. A method according to claim 4, wherein the at least one variable indicates a fraction of the individual units of the memory system to be placed in self-refresh mode.

7. A method according to claim 6, wherein the at least one variable is stored as a field in a mode register of the memory system.

8. An information handling system, comprising:
    a processor;
    a memory system communicatively coupled to the processor and having:
        individual units for storage of data; and
        a memory controller communicatively coupled to the individual units and configured to:

track whether the individual units are active or inactive, wherein an inactive individual unit is an individual unit that is in use, but not currently being accessed;

place inactive individual units in a self-refresh mode, such that the inactive individual units self-refresh their contents;

filter memory controller commands generated upstream of the memory controller, the filtering including:

determining that a first memory controller command is directed to a first inactive individual unit of the memory system that is in a refresh interval, and in response, delaying the first memory controller command to the inactive individual unit of the memory system to prevent an internal self-refresh conflict with the first memory controller command;

determining that a second memory controller command is directed to a second inactive individual unit of the memory system that is not in a refresh interval, and in response, determining that the second memory controller command is an explicit refresh command;

in response to determining that the second memory controller command is the explicit refresh command, blocking the explicit refresh command to the second inactive individual unit of the memory system placed in the self-refresh mode; and place active individual units in a command-based refresh mode, such that the active individual units are refreshed in response to a received command to refresh their contents.

9. An information handling system according to claim 8, wherein an individual unit of the memory system comprises one of a block, a page, a bank, and a rank.

10. An information handling system according to claim 8, wherein:
each individual unit comprises a page;
tracking whether individual units are active or inactive includes tracking whether individual pages are active or inactive; and
placing inactive individual units in a self-refresh mode includes placing banks having only inactive pages in a self-refresh mode, such that such banks self-refresh their contents.

11. An information handling system according to claim 8, further comprising setting at least one variable indicating which individual units are to be placed in the self-refresh mode, and which individual units are to be placed in the command-based refresh mode.

12. An information handling system according to claim 11, wherein the at least one variable is stored in a table such that an entry of the table is associated with an individual unit and indicates whether such individual unit of the memory system is to be placed in self-refresh mode or command-based refresh mode.

13. An information handling system according to claim 11, wherein the at least one variable indicates a fraction of the individual units to be placed in self-refresh mode.

14. An information handling system according to claim 13, wherein the at least one variable is stored as a field in a mode register of the memory system.

15. A memory system, comprising:
a processor;
a memory including individual units for storage of data; and
a memory controller communicatively coupled to the individual units and configured to:
track whether the individual units are active or inactive, wherein an inactive individual unit is an individual unit that is in use, but not currently being accessed;
place a first region including only inactive individual units in a self-refresh mode, such that the individual units of the first region self-refresh their contents;
filter memory controller commands generated upstream of the memory controller, the filtering including:
determining that a first memory controller command is directed to a first inactive individual unit of the memory system that is in a refresh interval, and in response, delaying the first memory controller command to the inactive individual unit of the memory system to prevent an internal self-refresh conflict with the first memory controller command;
determining that a second memory controller command is directed to a second inactive individual unit of the memory system that is not in a refresh interval, and in response, determining that the second memory controller command is an explicit refresh command;
in response to determining that the second memory controller command is the explicit refresh command, blocking the explicit refresh command to the second inactive individual unit of the memory system placed in the self-refresh mode; and
place a second region including active individual units in a command-based refresh mode, such that the individual units of the second region are refreshed in response to a received command to refresh their contents.

16. A memory system according to claim 15, wherein an individual unit of the memory system comprises one of a block, a page, a bank, and a rank.

17. A memory system according to claim 15, wherein:
each individual unit comprises a page;
tracking whether individual units are active or inactive includes tracking whether individual pages are active or inactive; and
placing inactive individual units in a self-refresh mode includes placing banks having only inactive pages in a self-refresh mode, such that such banks self-refresh their contents.

18. A memory system according to claim 15, further comprising setting at least one variable indicating which individual units are to be placed in the self-refresh mode, and which individual units are to be placed in the command-based refresh mode.

19. A memory system according to claim 18, wherein the at least one variable is stored in a table such that an entry of the table is associated with an individual unit and indicates whether such individual unit of the memory system is to be placed in self-refresh mode or command-based refresh mode.

20. A memory system according to claim 18, wherein the at least one variable indicates a fraction of the individual units to be placed in self-refresh mode.

21. A memory system according to claim 20, wherein the at least one variable is stored as a field in a mode register of the system.

* * * * *